United States Patent [19]
Tran

[11] Patent Number: 5,648,927
[45] Date of Patent: Jul. 15, 1997

[54] DIFFERENTIAL AMPLIFIER IN A MEMORY DATA PATH

[75] Inventor: Hiep Van Tran, Carrollton, Tex.

[73] Assignee: Texas Instruments Incorporated, Dallas, Tex.

[21] Appl. No.: 397,006

[22] Filed: Mar. 1, 1995

Related U.S. Application Data

[62] Division of Ser. No. 246,913, May 20, 1994, Pat. No. 5,418,737, which is a continuation of Ser. No. 583,521, Sep. 17, 1990, abandoned.

[51] Int. Cl.$^6$ .................................................. B11C 5/06
[52] U.S. Cl. ..................... 365/63; 365/196; 365/205; 365/220; 365/221
[58] Field of Search ............................. 365/63, 196, 205, 365/220, 221

[56] References Cited

U.S. PATENT DOCUMENTS

| | | | |
|---|---|---|---|
| 4,751,681 | 6/1988 | Hashimoto | 365/207 |
| 4,807,194 | 2/1989 | Yamada et al. | 365/207 |
| 4,897,569 | 1/1990 | Calzi | 365/208 |
| 4,910,713 | 3/1990 | Madden et al. | 365/207 |
| 4,943,944 | 7/1990 | Sakui et al. | 365/149 |
| 4,947,377 | 8/1990 | Hannai | 365/149 |
| 5,027,325 | 6/1991 | Katsura | 365/207 |
| 5,418,737 | 5/1995 | Tran | 365/63 |

OTHER PUBLICATIONS

Kazutami Arimoto, et al., A 60-ns 3.3-V-Only 16-Mbit DRAM with Multipurpose Register, IEEE Journal of Solid-State Circuits, vol., 24, No. 5, Oct. 1989, pp. 1184–1190.
Toshio Yamada, et al., A 4-Mbit DRAM with 16-bit Concurrent ECC, IEEE Journal of Solid-State Circuits, vol., 23, No. 1, Feb. 1988, pp. 20-26.

*Primary Examiner*—David C. Nelms
*Assistant Examiner*—F. Niranjan
*Attorney, Agent, or Firm*—Lawrence J. Bassuk; Stanton C. Braden; Richard L. Donaldson

[57] ABSTRACT

A memory array architecture is disclosed which funnels data through a series of sets of input/output data lines. Additionally, the invention allows a variable number of sense amplifiers to be used with a single local differential amplifier, thereby permitting high speed sensing.

15 Claims, 9 Drawing Sheets

DIFFERENTIAL AMPLIFIER IN A MEMORY DATA PATH

This is a divisional of application Ser. No. 08/246,913 filed May 20, 1994 U.S. Pat. No. 5,418,737 which is a continuation of application Ser. No. 07/583,521 filed Sep. 17, 1990 now abandoned.

BACKGROUND OF THE INVENTION

Memory architectures, particularly dynamic random access memory (DRAM) architectures currently exist for sizes up to 16 megabits. However, until now, no memory architecture has existed that is well suited for the next generations of memory of 64 megabits and beyond.

Figure 1:
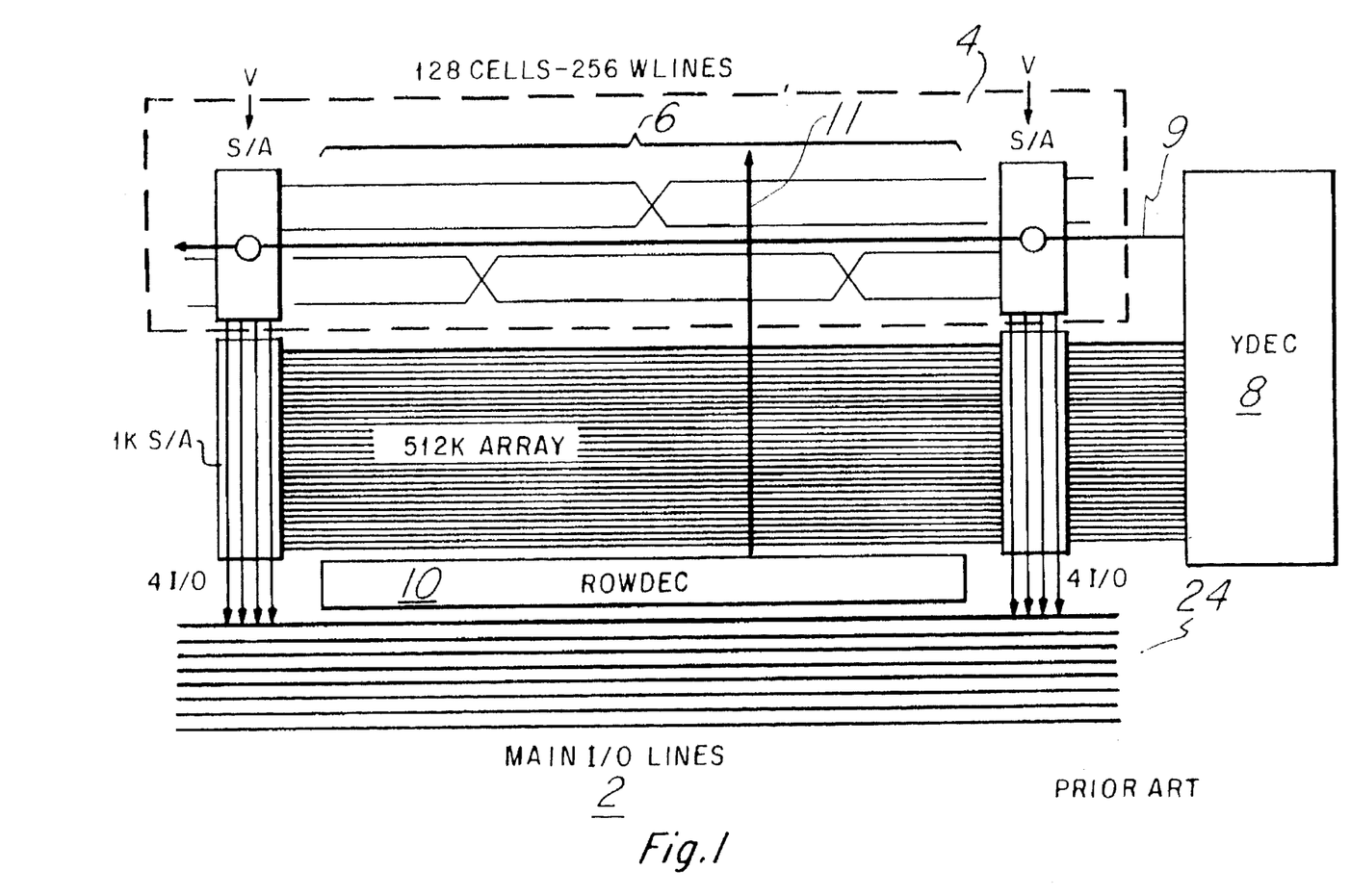
FIGS. 1 and 2 are schematic drawings of prior art memory architectures.

FIG. 1 illustrates a memory array architecture featuring grouped input/output lines (input/output also referred to as I/O). FIG. 1 illustrates one 512,000 bit memory array (hereinafter referred to as a 512k array) and its associated circuitry, being generally referenced at 2. One section of the array and its associated circuitry, out of 256 sections, consisting of circuitry, bound by the rectangular box and generally indicated by 4 is show, enlarged to facilitate discussion. The 512k array is associated with a pair of sense amplifier groups. Each group comprises 1024 sense amplifiers. One sense amplifier from each group is included within enlarged section 4 with each sense amplifier (also called sense amp) being labeled S/A. The remaining 1023 sense amplifiers in each group are generally labeled 1k S/A. Each vertical row (indicated along the directions of arrows v) of sense amplifiers can service two 512k arrays of memory. Bit lines, generally indicated at 6, are of the twisted type (each twisted pair comprising true and complement signals) and connect to two sense amplifiers from each 512k array. Therefore, each sense amplifier is connected to 4 bit lines as shown. However, note that since only one 512k array is shown, a pair of bit line connections for each sense amplifier is truncated along an outer edge for the other 512k array. For operation upon a memory cell, Y decoder 8 or as it is sometimes called, a column decoder, enables selection for at least one column of memory cells. Row decoder 10 selects the row of memory cells. The transmission media from row decoder 10 are word lines. As shown, one extended arrow 11 from row decoder 10 indicates word line selection by row decoder 10. An extended arrow 9 from Y decoder 8 represents column selection by Y decoder 8. Note that the vicinity of the intersection of a word line and a bit line can be equated to the location of a memory cell in the 512k array. After selection of a memory cell as a result of row and column selection by row decoder 10 and Y decoder 8, respectively, up to 4 pairs of input/output data can be sent to or received from the main input/output lines 24 from each group of sense amplifiers, hence, the term 11 grouped input/output lines 11. Pairs of data refers to true and complemented data. Consequently, up to 8 pairs of input/output data can be sent to or received from the main input/output lines from both groups of sense amplifiers per operating cycle.

With regard to the layout of the grouped input/output lines memory array architecture, 4 input/output line pairs fit within a sense amplifier pitch. A random logic layout for comparators exists for parallel testing of the memory.

If this architecture is adapted for use in a 64 megabit memory, 128 sets of the 512k array are needed. Therefore, sense amplifier activation is determined by the row decoder 10 for each 512k array. Consequently, 2048 sense amplifiers are activated per word line per 512k array. 64 bits of parallel testing is permitted with this memory adapted for 64 mega- bit use. Thus 128 bits can be tested simultaneously which results in 256 word lines being activated. A direct connection from sense amplifier to an associated input/output line exists. Consequently, a large capacitance exists on each input/output line since there are 256 word sense amplifiers per input/output. The major drawback of this architecture for adaptation to a 64 megabit memory is that out of so much available data, only a small portion can be selected at a time. Such poor selectivity is not suitable for good 64 megabit memory operation.

Figure 2:
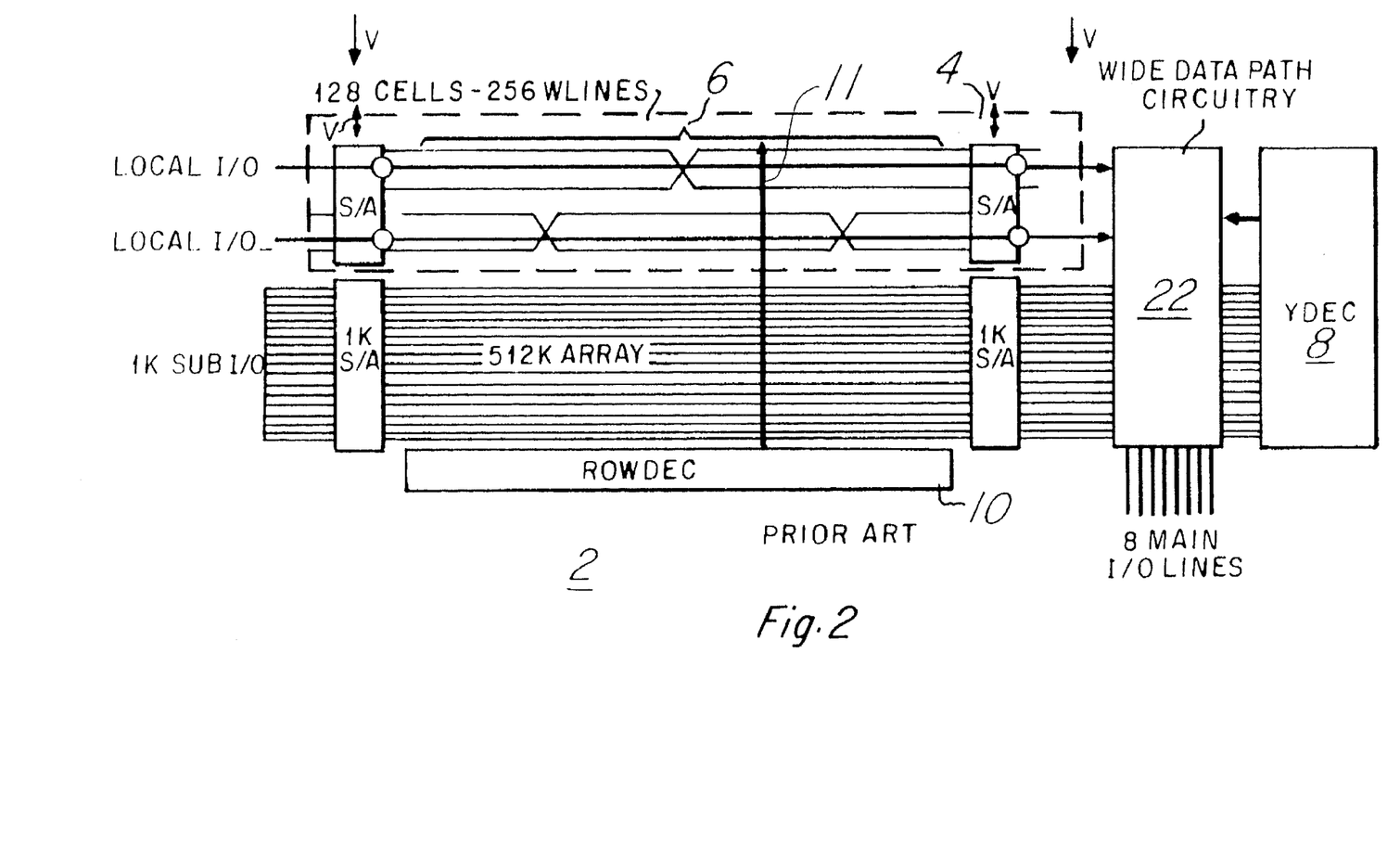

FIG. 2 illustrates a multiple input/output lines array architecture. FIG. 2 illustrates one 512,000 bit memory array and its associated circuitry, being generally referenced at 2. One section of the array and its associated circuitry out of 256 sections consisting of circuitry bound by the rectangular box and generally indicated by 4 is shown enlarged to facilitate discussion. The 512k array is associated with a pair of sense amplifier groups. Each group comprises 1024 sense amplifiers. One sense amplifier from each group is included within enlarged section 4 with each sense amplifier being labeled S/A. The remaining 1023 sense amplifiers in each group are generally labeled 1k S/A. Each vertical row (indicated along the directions of arrows v) of sense amplifiers can service two 512k arrays of memory. Bit lines, generally indicated at 6, are of the twisted type (each twisted pair comprising true and complement signals) and connect to two sense amplifiers from each 512k array. Therefore, each sense amplifier is connected to 4 bit lines as shown. However, note that since only one 512k array is shown, a pair of bit line connections for each sense amplifier is truncated along an outer edge for the other 512k array. Each sense amplifier can be connected directly to a pair of local input/output lines, shown as LOCAL I/O and LOCAL I/O__ lines. A pair of of these local input/output lines exists for each sense amplifier. The connection to the sense amplifiers by the local input/output lines are shown as dots. As with the grouped input/output lines architecture, row decoder 10 selects the row of memory cells. Each pair of bit lines 6 in a selected 512k array either transmits a data signal to, or receives a data signal from a sense amplifier S/A. This information is either sent to or received from wide data path circuitry 22. Thus, at this stage, 1024 sense amplifiers (selected alternately out of 2 groups of sense amplifiers) either send information to or receive information from wide data path circuitry 22. Consequently, 1024 input/output line pairs are activated per operating cycle per 512k array. Thus, this architecture has high active power dissipation. Column selection occurs in connection with the activation of local input/output lines and sense amplifiers, whereby information sent to or received by wide data path circuitry 22 is selected by Y decoder 8. Y decoder 8 selects 8 pairs of data from the 1024 pairs of data received from 1024 sense amplifiers to place on the 8 pairs of main input/output lines 24. Pairs of data is a term referring to true and complemented data.

Adaptation of this multiple input/output lines memory array architecture for a 64 megabit memory requires sense amplifier activation determined by the row decoder. Thus, 2048 sense amplifiers are activated per word line per 512k array. Since a direct connection exists, from a sense amplifier to input/output lines, the lines are capacitance dominated. 1024 bits per word line parallel testing is provided by this multiple input/output lines memory array architecture.

This architecture is not well suited for a memory size of 64 megabits or greater. Particularly, the high active power dissipation caused by the 1024 input/output line pairs activated per operating cycle per 512k array is undesirable in a 64 megabit memory array architecture.

OBJECTS OF THE INVENTION

It is an object of the invention to provide a new and improved DRAM architecture which allows high speed sensing.

It is another object of the invention to provide a DRAM architecture suitable for a memory of at least 64 megabits in size.

These and other objects of the invention, together with the features and advatages thereof, will become apparent from the following detailed specification when read together with the accompanying drawings in which applicable reference numerals have been carried forward.

ADVANTAGES OF THE INVENTION

The invention's architecture activates 2048 sense amplifiers per word line per 512k array. Further, per 512k array, a selectable number of input/output line pairs are activated per cycle, thereby reducing the active power used.

The invention's architecture scheme allows a plurality of sense amplifiers to be used with a single local differential amplifier thereby permitting high speed sensing.

Additional advantages of the invention are as follows as numbered below.

1. A compact layout of a differential amplifier in multiple sense amp pitches is provided.

2. Common I/O lines are used, resulting in reduced space usage.

3. Compared with the prior art, a reduced number of transistors are used together with separate column READ and column WRITE lines.

DETAILED DESCRIPTION OF THE INVENTION

Figure 3A:
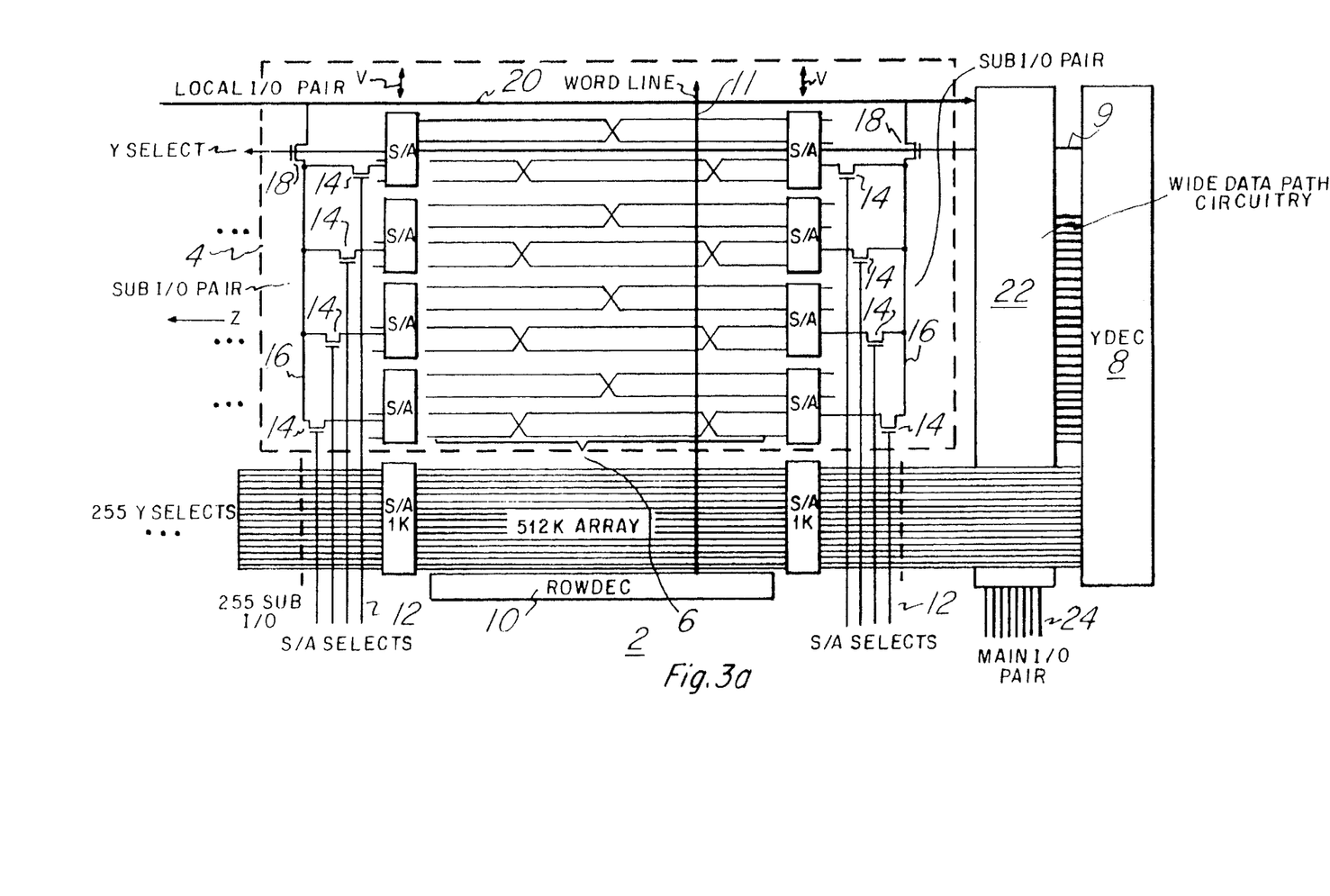
FIGS. 3a through 3e are schematic drawings illustrating the invention's architecture.

The invention's hierarchical multi-data lines DRAM array architecture is shown in the schematic drawing of FIG. 3a. FIG. 3a illustrates one 512K (524,288) bit memory cell array and its associated circuitry being generally referenced at 2. One section of the array, being generally referenced at 4, is shown enlarged to facilitate discussion. The 512k array is associated with two banks said 4 of 1024 sense amplifiers each grouped in sets of 4 sense amplifiers each, or 256-pair sets of 4 sense amplifiers in each bank. Two set of sense amplifiers is included within enlarged section 4 with each sense amplifier (also called sense amp) being labeled S/A. The remaining pairs of 1020 sense amplifiers in each bank are generally labeled 1k S/A. Each vertical row or bank (indicated along the directions of arrows v) of sense amplifiers can service two 512k arrays of memory. Bit lines, generally indicated at 6, are of the twisted type and connect to two sense amplifiers from each 512k array. Therefore, each sense amplifier is connected to 4 bit lines. However, note that since only one 512k array is shown, a pair of bit line connections for each sense amplifier is truncated along an outer edge for the other 512k arrays. For operation upon a memory cell, Y decoder 8, the column decoder, selects the column of memory cells and row decoder 10 selects the row of memory cells. The transmission media from row decoder 10 are word lines. As shown, one extended arrow 11 labeled word line and representing the same indicates word line selection by row decoder 10. An extended arrow 9 labeled Y select represents a column selection 1 and indicates column selection by Y decoder 8. Note that the vicinity of the intersection of a word line and a column can be equated to the location of a memory cell in the 512k array. Thus, extended arrow Y SELECT could have been shown at other locations along Y decoder 8 and likewise extended arrow WORD LINE could have been shown at other locations along row decoder 10. In conjunction with row decoder 10 of the 512k array shown and Y decoder 8, sense amplifier selection is accomplished such that access to the sense amplifier is determined by sense amp selection circuitry 12 which selects the proper sense amp pair in each set of sense amplifiers corresponding to the selected column. Sense amp selection circuitry 12 comprises selectable switches or transistor pairs 14, one of the transistors from pair 14 acting as a pass transistor to carry a true signal and the other transistor from the pair serving a a pass transistor to carry the complement of the true signal. Note, however, that a single transistor 14 symbol represents a pair of transistors, shown here as n-type, although p-type and bipolar transistors of the n-p-n or p-n-p variety could be used. Transistor pairs 14 are connected to an associated sub input/output line of a sub input/output pair 16. The transistor for transferring or passing the true signal is therefore connected to a sub input/output line for transmission of the true signal and the transistor for transferring or passing the complement of the true signal is connected to the other sub input/output line from the pair which serves to transmit the complement of the true signal. Note that a pair of the sense amp circuitry 12 can service an entire 512k array. A pair of selectable switches or pass transistors 18 are associated with each of the 256 sets of 4 sense amplifier pairs. As with transistor pair 14, transistor symbol 18 represents a pair of transistors, shown here as n-type transistors. Note, however, that p-type or bipolar transistors of the n-p-n or p-n-p variety could have been used. In connection with the selection of a particular sense amplifier S/A, determination thereof dictated in part by sense amplifier selection circuitry 12 and row decoder 10, a selected transistor pair 14 turns on in each set of sense amplifiers. Pass transistor pair 18, associated with one of the 256 sets of sense amplifiers turns on so as to provide access to a local input/output pair 20 of lines. Like the sub input/output pair 16 and transistor pair 14 relationship, a pass transistor from pair 18 for transferring or passing a true signal connects to a local input/output line from pair 20, for transmission of a true signal. Similarly, a pass transistor from pair 18 for transferring or passing a complemented signal connects to the other local input/output line from local input/output pair 20. A local input/output pair 20 for a respective set of the 256 sets of sense amplifier pairs in each array is coupled to wide data path circuitry 22. Selection circuits in wide data path circuitry 22 are controlled by decoder 8 to transfer data from selected pairs of the 256 local input/output pairs onto pairs of main input/output lines 24, the pairs comprising the true and complemented signals of the selected signals. For the particular case shown in FIG. 3a, 8 pairs of local input/output pair 20 are chosen from the 256 pairs of local input/output lines for placement of data onto or from the main input/output pairs 24, this being indicated by the 8 main I/O lines extending from the wide data path circuitry 22. However, fewer or more main input/ output lines and consequently fewer or more local input/ output pairs could have been chosen for selection and operation therupon. 128 of the 512k memory arrays described above are used to created 64 megabit memory. Y decoder 8 turns on selected transistors 18 for coupling data from a sub input/output line to a local input/output line. Selected transistors, are located along the direction indicated by arrow z. The local I/O lines and the bit lines also extend in the direction indicated by arrow z. Sense amplifier select circuitry 12 determines which group of sense amplifiers and consequently, data from which 512k array gets placed on a sub input/output pair. For instance, if 127 512k arrays and their associated circuitry were located along arrow z, then a signal from Y decoder 8 would turn on transistors 18 for the same set of sense amplifiers in each 512k array. The same signal determines the column of a selected memory cell. Sense amplifier selection circuitry 12 exists for each 512k array in the z direction as does a row decoder 10 for each 512k array. Therefore, sense amplifier select circuitry 12 performs as local select circuitry and determines which set of sense amplifiers are coupled to a sub input/output pair of lines. Note that the sense amplifier selection circuitry would couple the same sense amplifiers to sub input/output pairs in each of the 256 sets of sense amplifiers that exist along arrows v. However, Y decoder 8 determines which set out of the 256 sets gets selected so that through a transistor 18 a sub input/output pair is coupled to a local input/output pair. (The same local input/output pair is used for each array positioned along the z direction, there being 256 local input/output pairs per 512k array.) Y decoder 8 also controls multiplex selection of wide data path circuitry 22 for placement of data from the local input/output pairs to the main input/output pairs and vice versa.

Figure 3B:
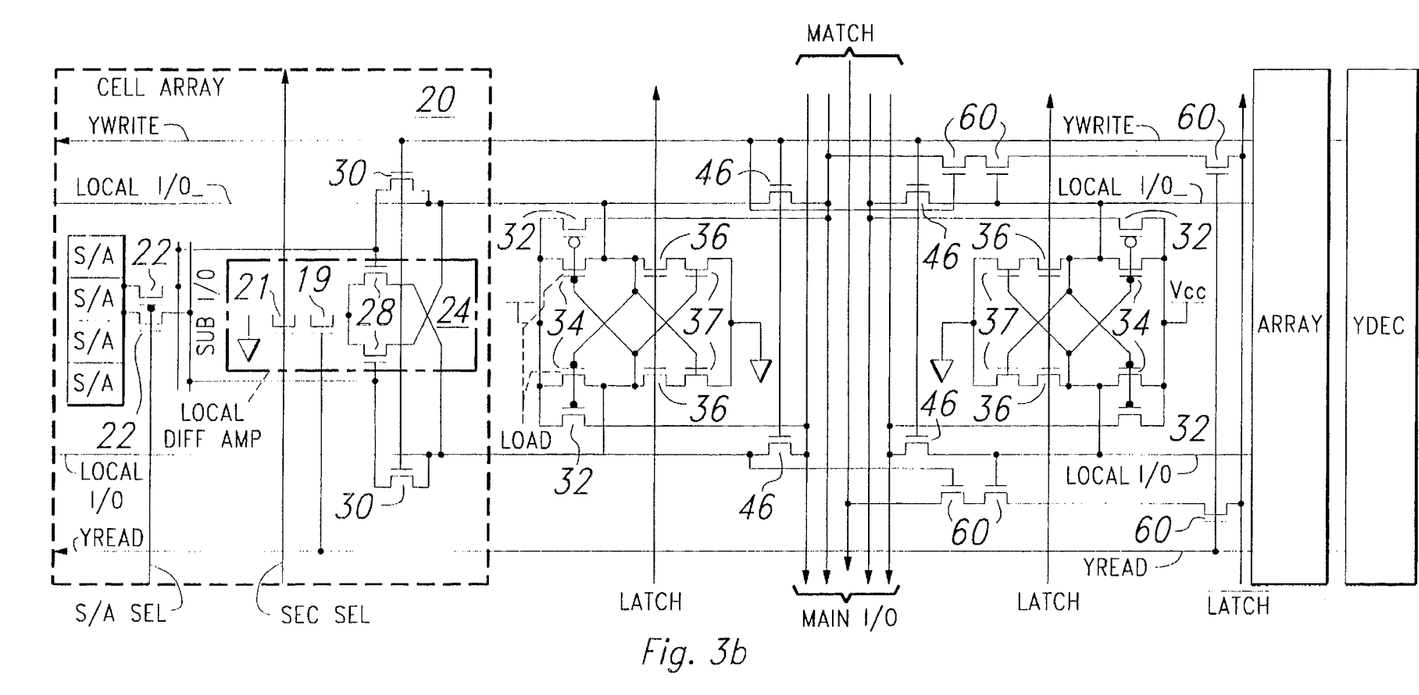
Figure 3C:
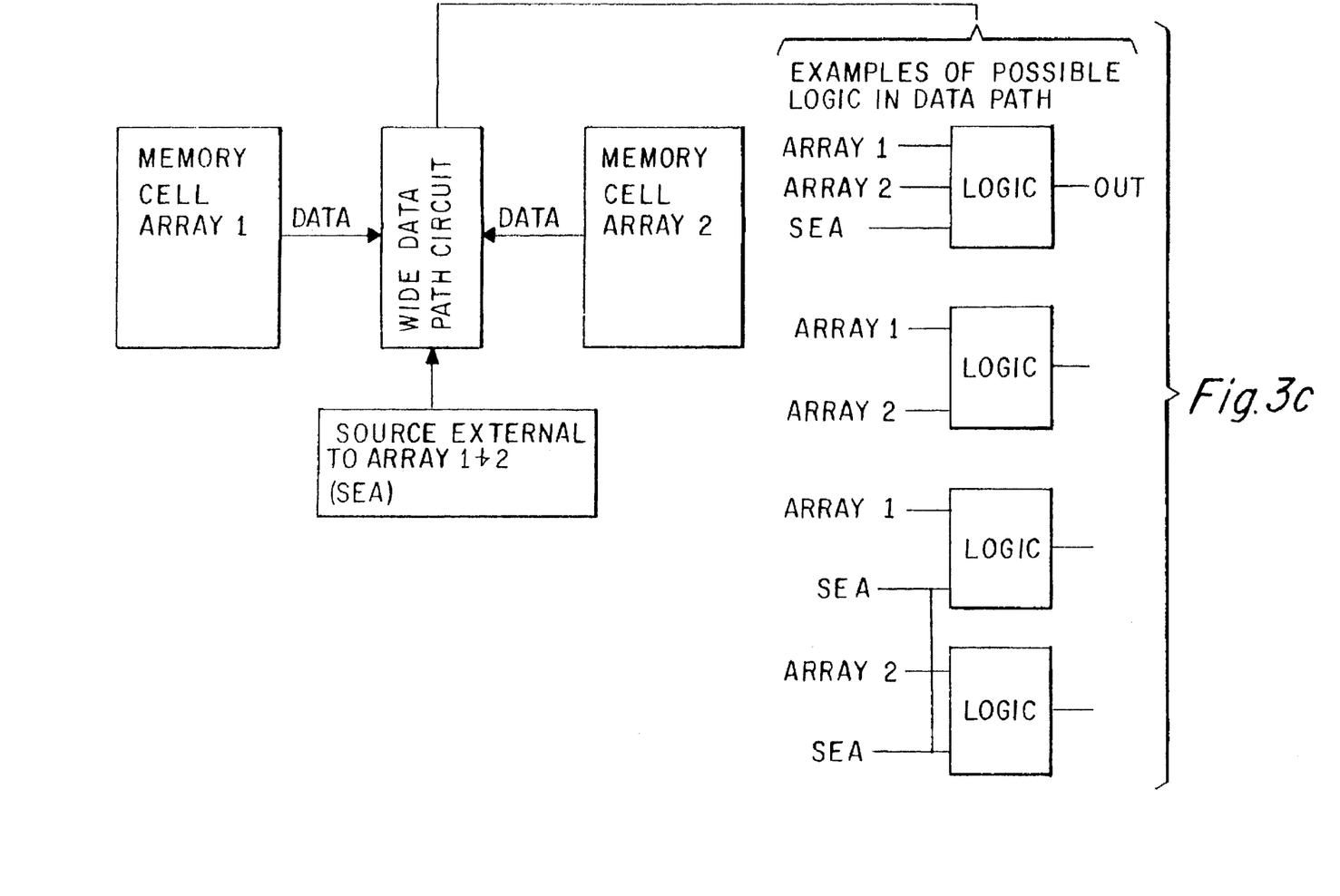

FIG. 3b illustrates a drawing which includes a circuit which implements a new and improved read/write data bus scheme for a high speed DRAM. The circuit for implementing this new and improved scheme is called a wide data path circuit and it is capable for use with a DRAM of size 64 megabits or greater. Physically, data travels or is transferred on the path of local input/output lines which are shared by memory arrays on each side of the wide data path circuit. The wide data path circuitry 22 comprises the local input/ output lines between memory arrays, the main I/O lines, associated main differential amplifier circuits and the physical space therebetween. With reference to the schematic drawing of FIG. 3c, as shown, data travelling on the wide data path which originates from either of two memory arrays or a location external the arrays is operated upon by logic connected to the local input/output lines in the wide data path. The logic operation may comprise ANDing, ORing, SHIFTING, complements of the foregoing or combinations thereof. With reference again to FIG. 3b, main input/output (I/O) lines are interposed between cell arrays. Each cell array 120 (note that only one cell array is shown in detail) contains a plurality (two or more) of sense amps S/A. Selection of a sense amplifier S/A is governed by a signal from a sense amp select line S/A SEL. Line S/A SEL selects a particular sense amp S/A in a set by delivering a high signal to the gate of a n-channel transistor 14 (note that for illustrative purposes, only two transistors 14 are shown for one sense amplifier eventhough others are present). A logic high signal on section select line SEC SEL turns on transistor 121 to allow the delivery of information to and from sense amps through local differential amplifier 124 comprised of n-channel transistors 128 and 130 arranged in the symmetrical fashion shown and connected to p-channel load transistors 134 in main differential amplifier 138.

READ operations are accomplished by sending a signal from column decoder YDEC along line YREAD. Local I/O line and (a line carrying its complement) line local I/O__ are precharged high by circuitry not shown. A high S/A SEL signal allows passage of data from a memory cell (not specifically shown) through a selected sense amp and onto a sub I/O line pair, one line carrying a true signal and the other carrying its complement signal. A differential signal from the sub I/O pair on the gates of each transistor 128 or control nodes of local differential amplifier 124 in connection with n-channel transistor 119 turning on as a result of a logic high voltage level on drive lines of transistors 128 connected to line YREAD creates a differential signal on a pair of local I/O lines, line I/O carrying a true signal and line I/O__ carrying its complement. The drive lines of transistors 128 act to sink current from the pre-charged local I/O lines. Differential signals on the local I/O lines are transferred to a pair of main I/O lines through transistors 132. In more detail, the local I/O lines connect to gates of transistors 1332 and 134 with the drive lines of transistors 132 sourcing current to teh amin I/O lines.

In connection with a WRITE operation on a memory cell, column decoder YDEC places a high signal on the gates of switches or pass transistors 130 after energizing line YWRITE. Data is transfered in through switches or n-channel pass transistors 146 through a pair of main I/O lines onto local lines I/O and I/O__. A drain/source connection of transistors 130 to a local line (I/O or I/O__) allows differential amplifier 124 to place data on a selected memory cell (not shown) through transistors 14 after selection by S/A SEL from a chosen sense amplifier.

Figure 3D:
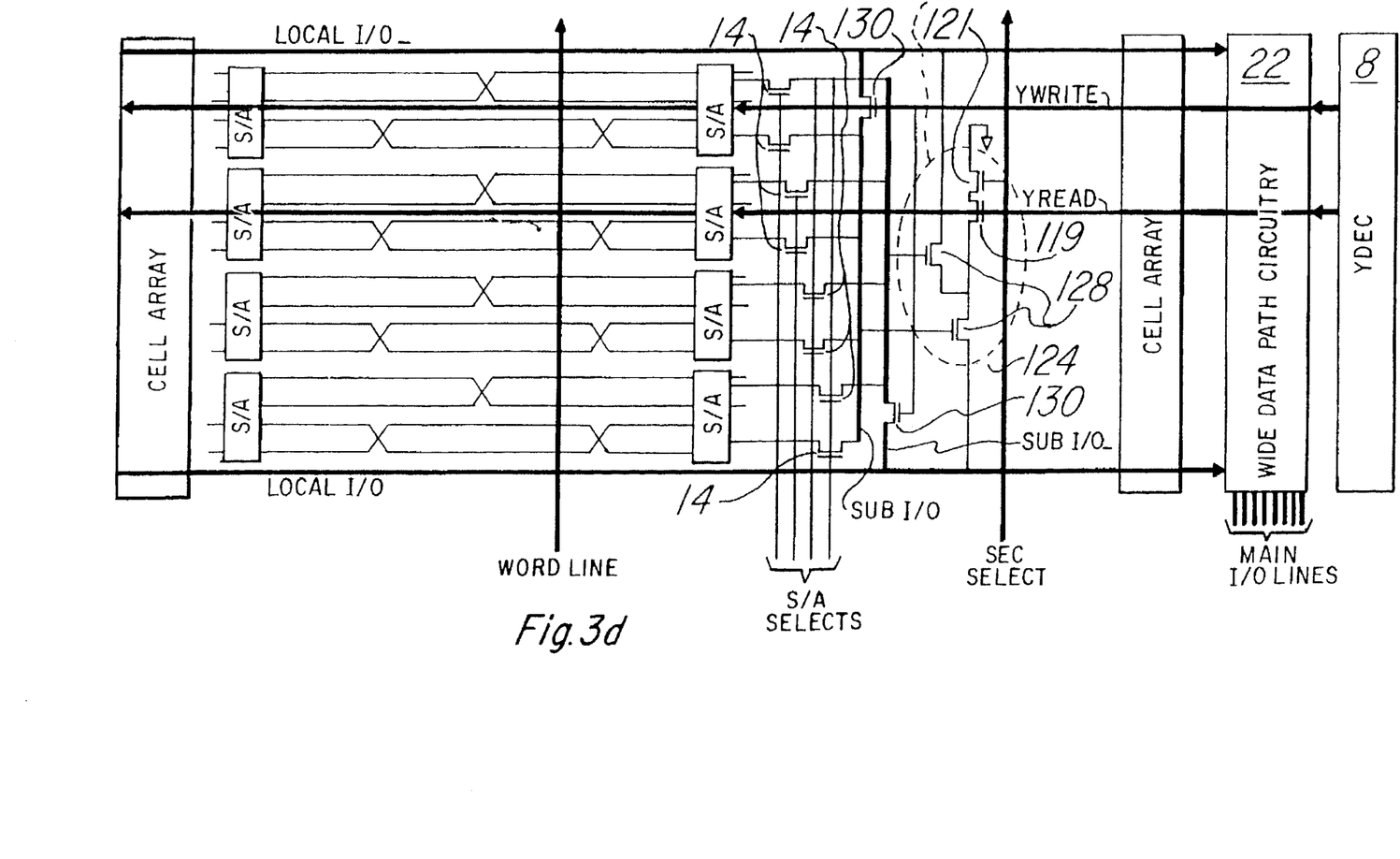

FIG. 3d illustrates another schematic drawing of the invention's DRAM architecture which shows in greater detail local differential amplifier 124, the sub I/O line pair (line sub I/O carrying a true signal and line sub I/O__ carrying its complement signal) and n-channel transistors 14 connected to respective sub I/O lines. Note that the local differential amplifier is physically located between the local I/O line and the local I/O__ line. Note also that four sense amplifiers are connected to each sub I/O line of the sub I/O pair. Local differential amplifier 124 connects to the sub I/O lines through transistors 128 and it fits within the pitch of four sense amplifiers as shown. However, a variable number of sense amplifiers can be connected connected to the sub I/O lines, requiring differential amplifier 24 to be used in connection with a variable number of sense amplifiers. Further, the local differential amplifier 124 can fit within the pitch of the variable number of sense amplifiers. For example, two, eight, fewer or more sense amplifiers can be connected to each sub I/O line from the sub I/O line pair and a local differential amplifier can fit within the pitches of these sense amplifiers. Local differntial amplifier 124 provides a high speed sensing circuit for a DRAM.

Figure 3E:
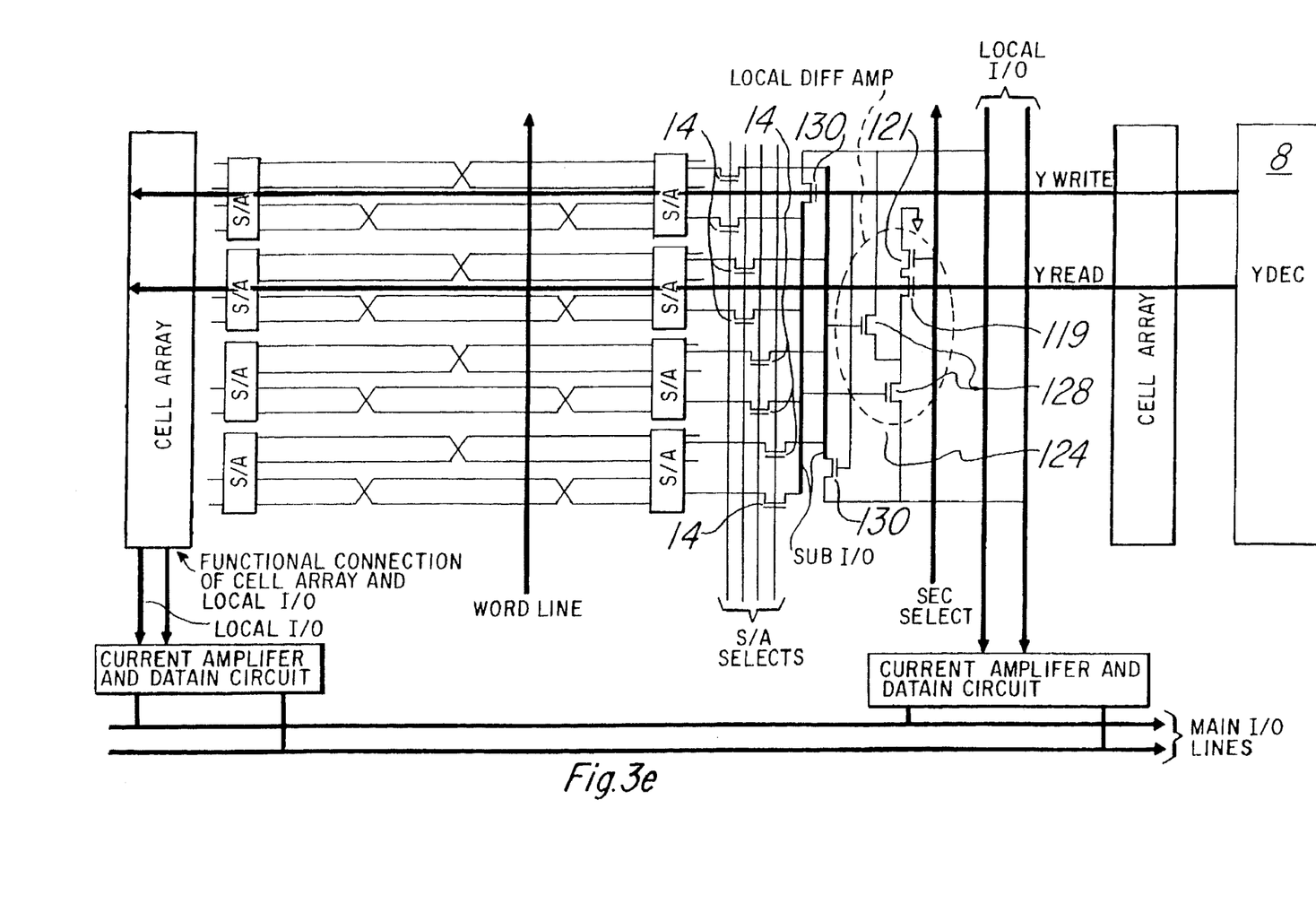

FIG. 3e illustrates another embodiment of the invention illustrating a schematic drawing of the invention's DRAM architecture with the preferred local input/output lines arrangement. Unlike previous invention embodiments which have local I/0 lines running parallel with lines YREAD and YWRITE, this embodiment provides a pair of local I/O lines for each 512k memory array which run perpendicular to the YREAD and YWRITE lines. A current amplifier and datain circuit (circuit for input of data to a cell array) is, as shown, placed at one end of the local I/O lines. However, the current amplifier and datain circuit could be placed at both ends or around the center of the array to receive data out from the local I/O pair and receive data in to the local I/O pair. A pair of main I/0 lines run alongside the current amplifier and datain circuits from cell arrays to carry data to and from cell arrays to input and output buffers (not shown).

Several important characteristics are realized by the invention's DRAM architecture as described above which are outlined as follows.

1. Sense amplifier select lines run parallel with sense amplifier columns (perpendicular with bit lines).

2. Sub input/output lines connect to a number of sense amplifiers, this number being determined by the number of sense amplifier select lines. For high speed operation, sub I/O lines are kept relatively short and connect to only a few sense amplifiers.

3. Sub input/output lines are connected to local input/output lines by the local differential amplifier during READ operations and by field effect transistors (preferably MOS transistors) during WRITE operations.

4. Data from sense amplifiers are amplified by the differential amplifier and the differential amplifier will drive the local I/O lines. Thus capacitive loading of the local I/O lines are isolated from sub I/O lines by the differential amplifier.

5. Information from the datain circuit travels from the local I/O lines to the sub I/O lines via MOS transistors (not shown) during WRITE operations. Sense amplifier select lines determine which sense amplifier will receive the data in and in the case of READ operations, which sense amplifier will put its data on the sub input/output lines.

6. Y READ and Y WRITE lines control the READ and WRITE operation of the architecture. Select lines are generated from YDEC and they can be arranged in a layout such that they travel across a cell array to reach columns of sense amplifiers which can be placed inside each cell array.

The invention's wide data path circuit greatly facilitates the testing of a memory through its MATCH circuitry. Because of the small geometries involved, it is practically infeasible to test individual memory locations in a memory array. Therefore, the same data is input to each memory cell and latched on local I/O pairs. Latching of data is accomplished by turning on transistors 136, each of which are interposed between p-channel transistors 134 and n-channel transistors 137 as shown. The combination of transistors 132, 134, 136 and 137 comprise a latching differential amplifier 138. Although two latching differential amplifiers 138 are shown, it is possible to use only one such amplifier between two arrays of memory, using multiplexed selection to determine access for use by either of the two arrays. One side of the latching differential amplifier is allowed to be pulled low in connection with a high signal on line LATCH. Line MATCH and a line carrying a complemented signal MATCH_ are coupled together by each n-channel transistors 160. In connection with an enabling signal on line YREAD, should the data match in two selected cells (one from each array shown), line MATCH will remain in its precharged state (line MATCH being precharged high prior to a MATCH operation). However, should the data differ, line MATCH will be pulled low through a continuous string of turn on transistors 160 connecting line MATCH to line MATCH_. This indicates an error in a memory cell signaling that the integrated circuit memory is defective. Although only two cell arrays have been shown in FIGS. 3b and 3c, it should be noted that this testing scheme is applied to all of the cell arrays of the memory.

Figure 4:
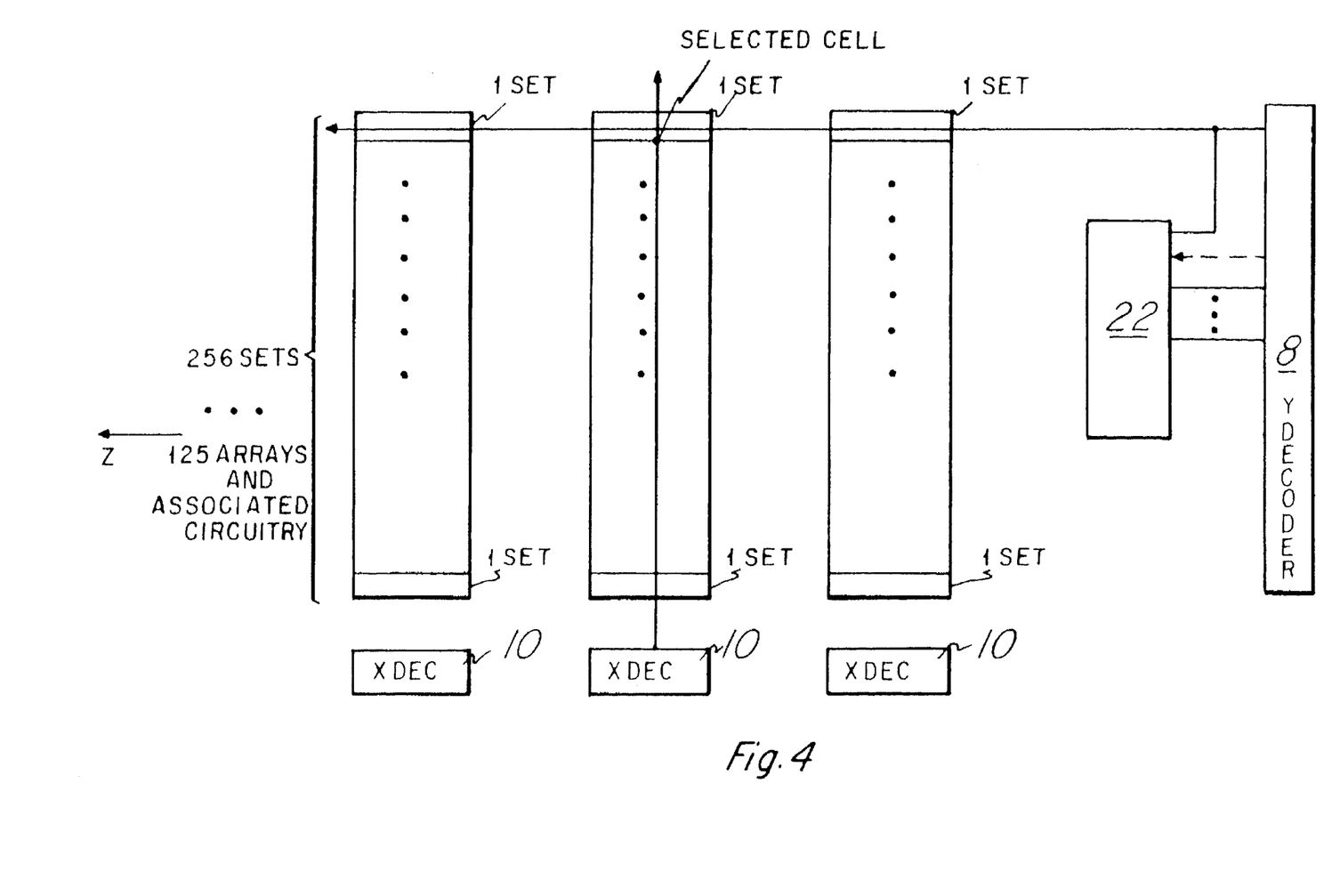
FIG. 4 is a schematic drawing which illustrates the invention as applied to a 64 megabit memory scheme.

FIG. 4 is a schematic drawing illustrating the a general scheme for the invention 64 megabit memory. Note that although the same signal from Y decoder 8 can select a local input/output pair as well as determine a multiplexed selection from wide data path circuitry 22, a signal from Y decoder 8 which is different from the one that selects the local input/output pair can be used (as shown by the dotted line arrow). The bit lines and input/output lines are not shown. However, the approximate vicinity of a selected memory cell is indicated.

Figure 5:
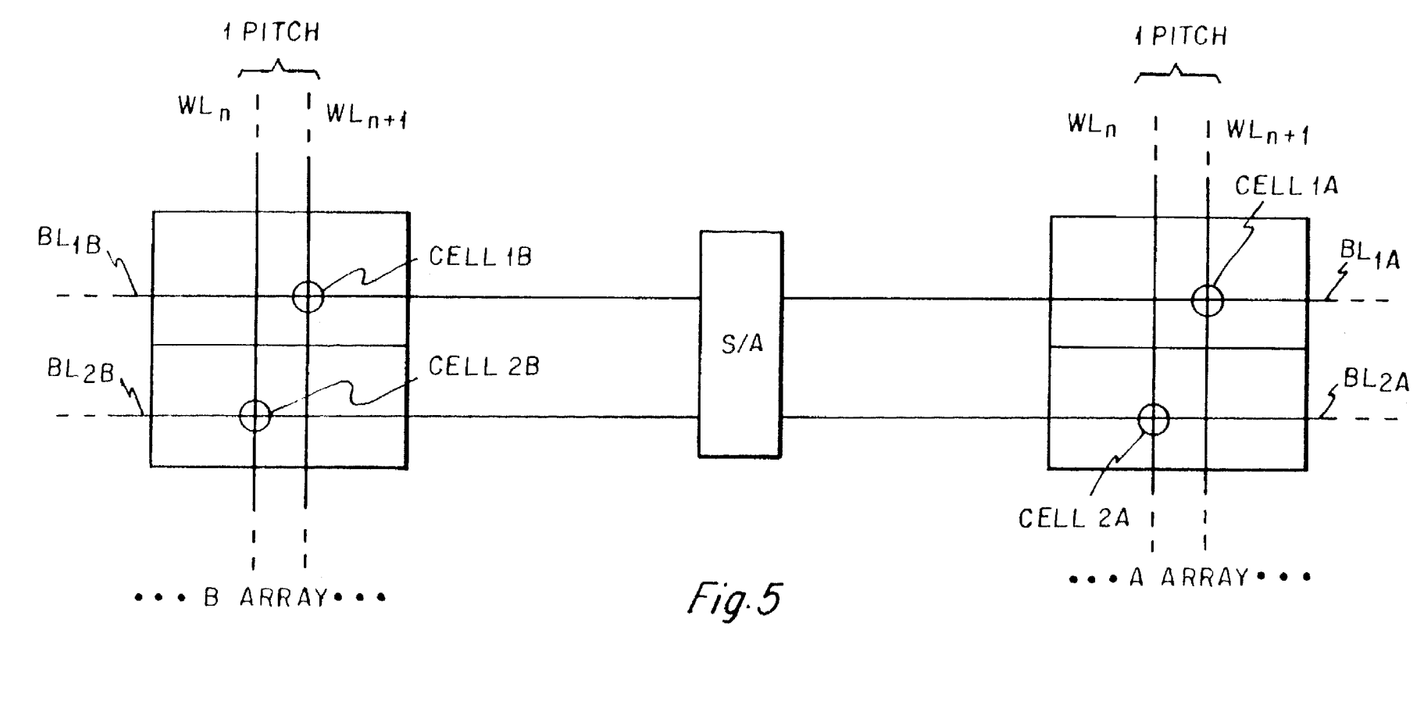
FIG. 5 is a schematic drawing illustrating another aspect of the invention.

FIG. 5 is a schematic drawing illustrating another aspect of the invention. Note that the memory cells 1A and 2A fit within a single pitch. Such is also the case with memory cells 1B and 2B. Sharing of a sense amp S/A between two 512k arrays is also shown in FIG. 5. Bit lines $BL_{1B}$ and $BL_{2B}$ are connected to sense amp S/A from the B array of 512k memory while bit lines $BL_{1A}$ and $BL_{2A}$ are connected to sense amp S/A from the A array of 512k memory.

The preferred timing of operation of the sense amplifiers is such that signals received from the bit lines are amplified and next, bit line voltages are restored.

A differential amplifier can be used with timing such that it receives signals from the bit lines, amplifies the signals and then transfers data to the input/output lines. Next, the differential amplifier latches the data on the input/output lines.

The foregoing architecture provides a memory structure that allows high-speed sensing for use with a high-speed sense amp timing scheme. 256 bits per word line parallel testing is also provided. The wide data path circuitry can be used in a layout of comparators and registers that fit within a pitch of a number of memory cells. Within a 512k set of memory, 2,000 sense amps can be activated per word line. Furthermore, a selectable number of I/O pairs are activated per cycle. Thus, it is possible to do a cell-test with on-chip pattern generation because of the selectable number of input/output pairs.

As disscussed in the foregoing, a sub input/output pair places data on a local input/output pair which in turn places data on a main input/output pair. Generally, the data available to the sub input/output pairs outnumber the data available to the local input/output pairs. Further, generally the local input/output pairs greatly outnumber the main input/output pairs. Hence, the name hierarchical multi-data lines is applied to the invention's architecture.

Although the invention has been described in detail herein with reference to preferred embodiments and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. For instance, although the foregoing invention's architecture has been described in detail for a DRAM, it may readily be used for a static random access memory (SRAM). It is contemplated that all such changes and additional embodiments are within the spirit and true scope ot the invention as claimed below.

I claim:

1. A differential amplifier comprising:

a. true and inverted control nodes receiving respective true and inverted data signals from sense amplifiers in an array of memory cells;

b. true and inverted drive nodes, electrically separate from the control nodes, receiving a pre-charge to a high voltage, the drive nodes carrying respective true and inverted data signals;

c. only one pair of cross-coupled transistors each transistor having a gate and source-drain leads, the gate of one transistor being connected to the true control node and the gate of the other transistor being connected to the inverted control node, one source-drain lead of each transistor being connected to a reference node, the other source-drain lead of the one transistor being connected to the inverted drive node and the other source-drain lead of the other transistor being connected to the true drive node, the pair of transistors conducting precharge from only one of the drive nodes to the reference node to form true and inverted data signals on the drive nodes; and d. a switch connecting the reference node to a reference voltage node.

2. The differential amplifier of claim 1 in which the switch includes two transistors each adapted to receive respective control signals.

3. The differential amplifier of claim 1 in which the transistors are N-channel.

4. The differential amplifier of claim 1 in which the transistors are formed in an integrated circuit.

5. The differential amplifier of claim 1 in which the control nodes and drive nodes are connected to internal I/O lines in a random access memory.

6. The differential amplifier of claim 1 including a pair of pass transistors having gates and source-drain leads, the source-drain leads of each pass transistor being connected between a control node and a drive node and the gates being adapted to receive a pass control signal.

7. A differential amplifier comprising:

a. a pair of control nodes receiving true and inverted data signals;

b. a pair of drive nodes, electrically separate from the control nodes, receiving a pre-charge to a reference voltage;

c. four transistors, each transistor having a gate and source-drain leads, one source-drain lead of each transistor being connected to a supply voltage, the gates of the first and second transistors being connected to one control node and the gates of the third and fourth transistors being connected to the other control node, the other source-drain lead of the first transistor being connected to one drive node, the other source-drain lead of the second transistor being connected to the other control node, the other source-drain lead of the third transistor being connected to the one control node, and the other source-drain lead of the fourth transistor being connected to the other drive node.

8. The differential amplifier of claim 7 in which the four transistors are P-channel transistors.

9. The differential amplifier of claim 7 in which the second and third transistors are load transistors.

10. The differential amplifier of claim 7 in which the transistors are formed in an integrated circuit.

11. The differential amplifier of claim 7 in which the transistors are connected to internal I/O lines in a random access memory.

12. The differential amplifier of claim 7 including a pair of pass transistors having gates and source-drain leads, the source-drain leads of each pass transistor being connected between a control node and a drive node and the gates being adapted to receive a pass control signal.

13. The differential amplifier of claim 7 including a latch, the latch having a top node, a bottom node and two side nodes, the second and third transistors connecting the top node to the side nodes, which form the control nodes, the first and fourth transistors connecting the top node to the drive nodes, the top node being connected to the supply voltage, fifth and sixth transistors connecting the side nodes to the bottom node and the bottom node being connected to a reference voltage, the fifth and sixth transistors having gates and the gates of the second, third, fifth and sixth transistors being cross coupled in the latch.

14. The differential amplifier of claim 13 including a pair of switch transistors, the pair of switch transistors separating the control nodes from the fifth and sixth transistors, and a latch line connected to the pair of switch transistors.

15. The differential amplifier of claim 13 in which the fifth and sixth transistors are N-channel transistors.

* * * * *